United States Patent [19]
Schweighofer

[11] Patent Number: 5,949,668
[45] Date of Patent: Sep. 7, 1999

[54] POWER AMPLIFIER WITH MULTIPLE SWITCHED OUTPUT STAGES, AND METHOD AND DRIVER FOR OPERATING SAME

[75] Inventor: Peter Schweighofer, Nuremberg, Germany

[73] Assignee: Siemens Aktiengesellschaft, Munich, Germany

[21] Appl. No.: 09/037,312

[22] Filed: Mar. 9, 1998

[30] Foreign Application Priority Data

Mar. 10, 1997 [DE] Germany ............. 197 09 766

[51] Int. Cl.⁶ ............. H02M 7/00; H02M 3/24; H02M 7/521; H02H 7/122
[52] U.S. Cl. ............. 363/71; 363/58; 363/98; 363/136
[58] Field of Search ............. 363/58, 71, 98, 363/132, 136

[56] References Cited

U.S. PATENT DOCUMENTS

| | | | |
|---|---|---|---|
| 4,025,859 | 5/1977 | Smith ............. | 318/696 |
| 5,508,905 | 4/1996 | Reichard ............. | 363/71 |
| 5,523,632 | 6/1996 | Seragnoll ............. | 307/125 |
| 5,546,299 | 8/1996 | Lenz ............. | 363/71 |
| 5,631,817 | 5/1997 | Minami ............. | 363/98 |
| 5,768,114 | 6/1998 | Gruning et al. ............. | 363/58 |

*Primary Examiner*—Peter S. Wong
*Assistant Examiner*—Bao Q. Vu
*Attorney, Agent, or Firm*—Hill & Simpson

[57] ABSTRACT

In a method for the drive of a number of coupled output stages drive signals for the output stages are generated. Given an over-voltage condition in one of the output stages, the output stage affected by the over-voltage condition is switched into a charge output mode for a limited time duration and at least one other output stage is switched into a charge pick-up mode for a limited time. This method is utilized in the operation of a control module and of a power amplifier, and achieves a charge compensation or balancing or equalization between the output stages with very little circuit-oriented outlay.

12 Claims, 2 Drawing Sheets

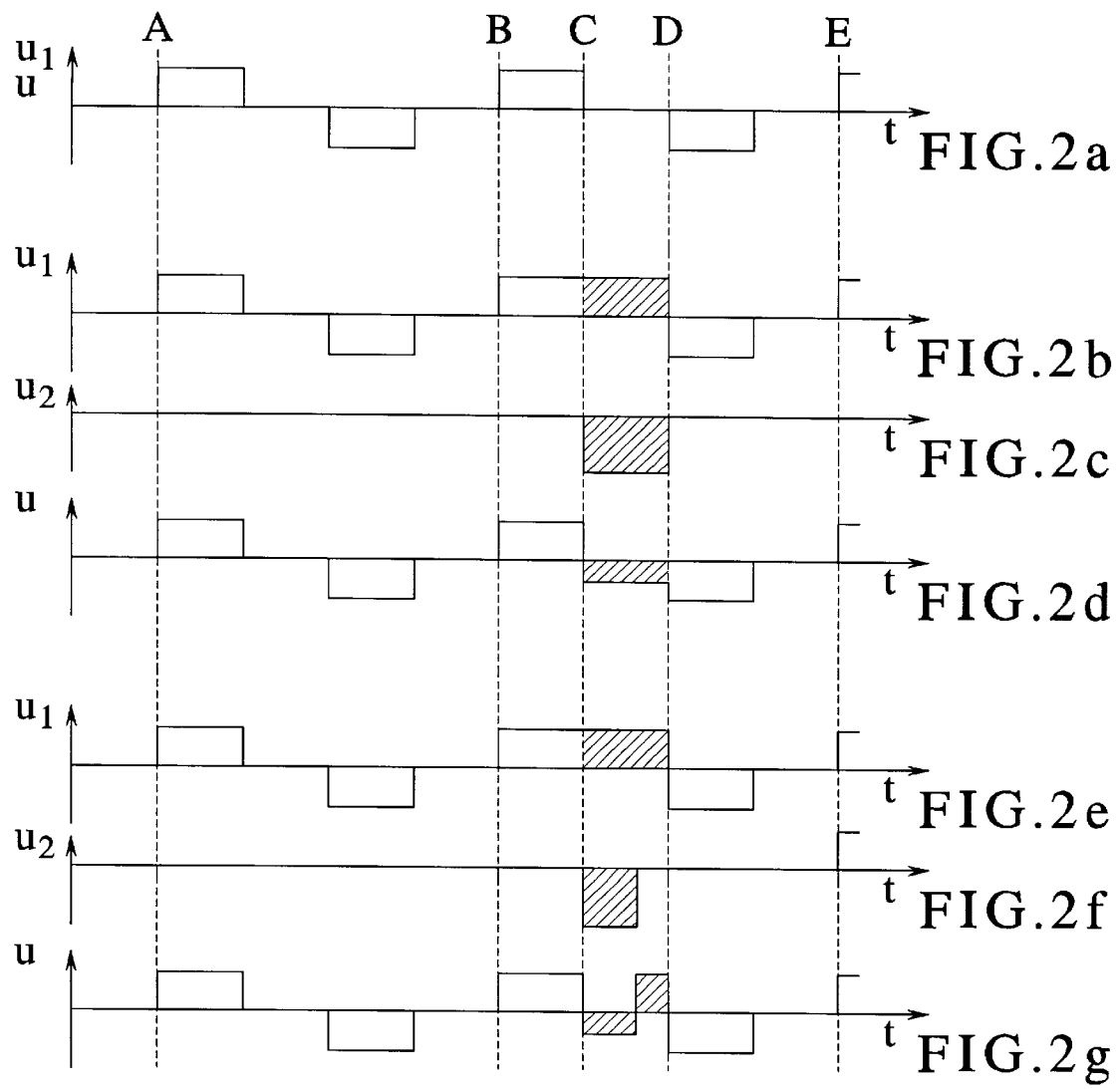
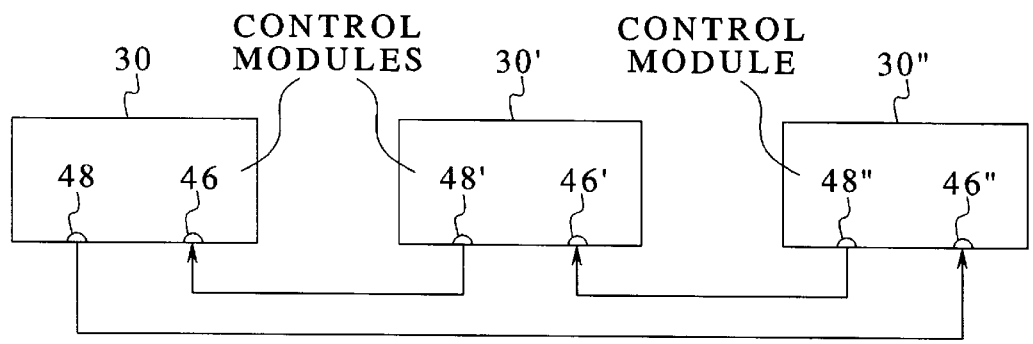
FIG.3

POWER AMPLIFIER WITH MULTIPLE SWITCHED OUTPUT STAGES, AND METHOD AND DRIVER FOR OPERATING SAME

BACKGROUND OF THE INVENTION

1. Field of the Invention

The present invention is directed to a power amplifier of the type having multiple, switched output stages and containing a driver which operates the output stages. The present invention is also directed to a driver for such a power amplifier, and to a method for operating such a power amplifier. The invention is preferably utilized in a gradient amplifier of a nuclear magnetic resonance tomography apparatus that has a number of series-connected switched output stages for driving a gradient coil.

2. Description of the Prior Art

German OS 43 04 517 corresponding to U.S. Pat. No. 5,546,299, discloses a power supply for an inductive load wherein two switched output stages are connected in series at the output side. A control arrangement composed of two control modules generates drive signals for active switch elements of the output stages.

During operation, the output stages apply a voltage of, for example, several hundred volts to the gradient coil in order to periodically build up and dismantle an exactly regulated current of, for example, 300 A. Given a number of coupled output stages, operating conditions are possible in which an energy transfer between the output stages occurs.

When, for example, the predetermined shape of the current curve exhibits steep leading edges and flatter trailing edges and the output stages assume the function of a basic load output stage and a peak load output stage, it can occur that the peak load output stage is only cut in during the steep leading edges of the current. The energy supplied as an output by the peak load output stage to the gradient coil is then returned exclusively to the basic load output stage during the flatter trailing edges of the current. This can lead to an excessive charging (over-voltage) of a charging capacitor in the basic load output stage, and thus to a malfunction of or damage to the gradient amplifier.

Such an undesired charging of an output stage is also possible when the output stages are differently driven (for example, supply output voltages of different polarity), when they exhibit different properties (for example, in view of clock frequency or intermediate circuit voltage) or when a unit known as a booster is connected to the load circuit.

As a first alternative for avoiding over-voltages, German OS 43 04 517 and U.S. Pat. No. 5,546,299 disclose the use of discharge resistors that are connected parallel to the charging capacitors. The energy consumption and the dissipated heat of the output stages, which must be conveyed away with a cooling arrangement increase substantially due to such discharge resistors. As a second alternative, German OS 43 04 517 and U.S. Pat. No. 5,546,299 employ switchable discharge means (DC—DC converters) for the energy distribution between the output stages. Such discharge means, however, are complicated in terms of their realization, particularly when more than two output stages are provided.

SUMMARY OF THE INVENTION

An object of the present invention, is to provide a drive method, a control module and a power amplifier of the above type wherein the aforementioned problems are avoided. In particular, an over-voltage produced by an excessive charging of an output stage should be capable of being reliably dismantled with little circuit-oriented outlay.

The above object is achieved in accordance with the principles of the present invention in a power amplifier having multiple, switched output stages and a driver circuit therefor, and in a method for operating the power amplifier, wherein an over-voltage condition of one of the output stages is identified, the output stage affected by the over-voltage condition is switched into a charge output mode for a limited time duration by means of drive signals, and at least one of the other output stages is switched into a charge pick-up mode for a limited time duration by means of drive signals. The output stages are coupled so that energy which is supplied by the output stage which has been switched into the charge output mode is picked up by the (at least one) output stage which has been switched into the charge pick-up mode.

The invention is based on the fundamental idea of exchanging charge or energy between the output stages in a specific charge transfer mode via the normal load circuit. This enables a charge compensation or equalization or balancing without requiring additional discharge or energy distribution means. The circuit-oriented outlay for the inventive approach is extremely low.

The invention can be utilized for all types of power amplifiers with multiple coupled output stages. A precondition, however, is that the output stages are coupled such that the energy output by one output stage in a charge output mode can be picked up by at least one other output stage in a charge pick-up mode. In the normal case, this means that the output circuits are connected in series at the output side in the load circuit.

As used herein a "charge output mode" means every operating condition of an output stage in which charge is suppled as an output to the load circuit and a "charge pick-up mode" means every operating condition of an output stage wherein charge is picked up from the load circuit. In particular, these operating conditions can be characterized by the presence of an intermediate circuit voltage at an output of the output stage with a suitable polarity that is dependent on the direction of current flow in the load circuit.

The charge output mode of the output stage exhibiting the over-voltage and the charge pick-up mode of at least one other output stage preferably occur substantially simultaneously, i.e. at least partially overlapping. Certain time shifts, however, are innocuous when the duration of these operating conditions is significantly shorter than the current variation time in the load circuit.

Given a charge transfer mode formed of a charge output and corresponding charge pick-up, the amplitude-time area of the voltage signal of the delivering output stage is preferably equal to the amplitude-time area of the voltage signal at the accepting output stage or stages. The quantity of energy output is then equal to the quantity of energy picked up. When output stages having different intermediate circuit voltages are involved, then the duration of the charge transfer mode in the output stage with higher intermediate circuit voltage is correspondingly shorter than in the output stage with lower intermediate circuit voltage.

As an alternative, a uniform duration of every charge transfer mode in the participating output stages can also be provided (identical amplitude-time areas) independently of the amplitude of the intermediate circuit voltages. A predetermined charge quantity is then transferred between the output stages. When the intermediate circuit voltages are unequal, then a differing amount of energy is output or picked up by the respective output stages. The energy difference flows to the load circuit, or is taken therefrom, causing the flow of current in the load circuit to change. This disturbance, however, can be compensated in turn by a suitable control means. An especially good compensation (balancing, equalization) is possible when a corresponding correction signal is supplied to the control means.

The duration of the charge transfer mode is preferably short compared to the current variation time in the load circuit defined by the load inductance. The charge transfer mode is repeated until the over-voltage is dismantled. The output stage accepting the charge can either be permanently prescribed for each charge-delivering output stage or it can be selected in a suitable way (for example, dependent on charge state).

An especially simple circuit-oriented embodiment is obtained when each charge transfer mode is controlled by a switch clock of the corresponding output stage. Each charge transfer mode can correspond to a switch clock cycle or a whole multiple thereof. During this time span, the drive of the output stages serves completely for charge transfer without having to take further switch signals into account. When a charge transfer mode lasts over a number of switch clocks (pulses), different intermediate circuit voltages of the output stages can also be taken into consideration. A common switch clock can be provided for the output stages; however, each output stage can also exhibit its own switch clock.

The charge transfer modes can be integrated especially disturbance-free into the overall operation of the gradient amplifier when they are inserted as segments into a regular switch clock cycle or when a switch clock cycle is lengthened by such segments.

The over-voltage condition of an output stage is preferably determined by measuring an intermediate circuit voltage at a charging capacitor. The required measuring means can be optionally structurally allocated to the output stage or to the control module.

Fundamentally, the inventive method can be modified such that instead of recognizing an over-voltage state, an under-voltage state of the output stages that is recognized. This results in an equivalent method when a power amplifier has the property that an under-voltage state in one output stage occurs together with an over-voltage state in another output stage.

The inventive method is preferably implemented in a control unit ir control stage of a power amplifier. The method can be performed by hardware or software. The control stage is preferably modularly constructed, and includes a number of control modules connected to one another that implement the method in cooperation. A central control logic can be provided in addition or as an alternative to the control modules.

Only little communication between the control modules is required in a preferred embodiment. The control modules each have only one input and one output for a charge transfer signal when the current amplitude-time area or voltage amplitude-time area to be adhered to is defined in advance. An arbitrary number of control modules can be connected to one another in a ring topology. In alternative embodiments, the control modules can exchange more extensive information with one another, particularly about the energy or charge amount to be transferred.

DESCRIPTION OF THE DRAWINGS

FIGS. 2a–g are time diagrams of voltage signals for explaining the invention.

FIG. 3 is a block circuit diagram of a control means formed of three control modules constructed and operating in accordance with the invention.

DESCRIPTION OF THE PREFERRED EMBODIMENTS

Figure 1:
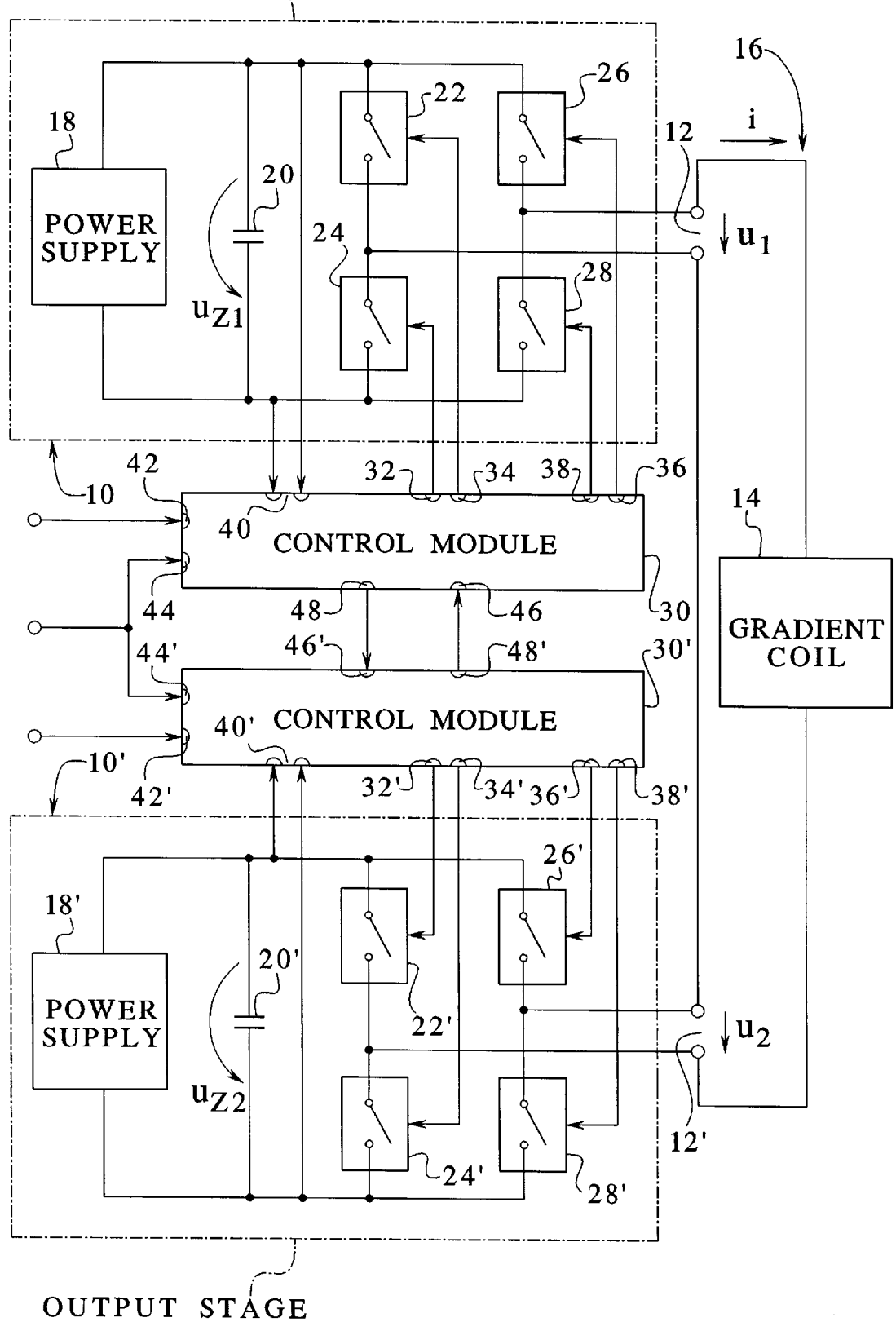
FIG. 1 is a block circuit diagram of components of a gradient amplifier with a connected gradient coil constructed and operating in accordance with the invention.

The gradient amplifier shown in FIG. 1 has two virtually identical output stages 10, 10' that are fashioned as switched output stages and at whose outputs 12, 12' voltages $u_1$ and $u_2$ are present. The outputs 12, 12' are connected in series and to a load circuit 16 with an inductive load, a gradient coil 16 here. A current i flows in the load circuit 16.

A power supply 18 that supplies an intermediate circuit voltage $u_{Z1}$ buffered by a charging capacitor is provided for the output stage 10. Four active switch elements 22, 24, 26, 28 that, for example, can be fashioned as FET transistors are series-connected by pairs and are connected to the power supply 18 and to the charging capacitor 20. They form a full bridge circuit with which the intermediate circuit voltage $u_{Z1}$ can be applied to the outputs 12 of the output stage 10 in with changing polarity. Suitable unbiased diodes are provided for the switch elements 22, 24, 26, 28.

A control module 30 serves for the drive of the output stage 10 and has drive outputs 32, 34, 36, 38 that are respectively connected to control inputs of the active switch elements 22, 24, 26, 28. Further, a sampling input 40 formed of two terminals is provided, the intermediate circuit voltage $u_{Z1}$ being present at this sampling input 40. This voltage is measured by a suitable measuring circuit of the control module 30 in order to recognize an over-voltage state of the output stage 10.

The control module 30 further has an input signal input 42 for applying an input signal that indicates the output voltage $u_1$ of the output stage 10 desired during the normal amplification mode. A current direction input 44 is provided for a current direction signal. The current direction signal indicates at least the direction of the current i in the load circuit 16, and possibly the intensity of the current as well. It is derived from a measured value determined by a suitable measuring means, for example a bushing transformer. Finally, a charging signal input 46 and a discharge signal output 48 are provided at the control module 30.

The output stage 10' is constructed with a power supply 18', a charging capacitor 20' and four active switch elements 22', 24', 26', 28', just like the output stage 10. The output stage 10' has an intermediate circuit voltage $U_{Z2}$ and an output voltage $u_2$. Corresponding to the control module 30, further, a control module 30' with drive outputs 32', 34', 36', 38', a sampling input 40', an input signal input 42', a current direction input 44', a charging signal input 46' and a discharge signal output 48' are provided.

The current direction inputs 44, 44' are connected to one another, whereas two separate input signals are applied to the input signal inputs 42, 42'. The discharge signal output 48 of the control module 30 is connected to the charging signal input 46' of the control module 30', and vice versa.

During normal operation, the control modules 30, 30' generate drive signals clocked with a pulse-width modulation for the switch elements 22, 24, 26, 28, 22', 24', 26', 28' of the output stages 10, 10' in a known way (see German OS 43 04 517, FIG. 6 and FIG. 7 and appertaining description) such that the output voltage $u_1$ is determined by the input signal at the input 42 and the output voltage $u_2$ is determined by the input signal at the input 42'. The control modules 30, 30' have separate clock generators for generating respective switch clocks for the drive signals. The clock frequency, however, is the same in both control modules 30, 30' and amounts, for example, to 50 kHz. In alternative embodiments, the control modules 30, 30' can have different switch clock frequencies, or a common clock generator, or a synchronization of the switch clocks can be provided.

The direction of the current i and the polarities of the voltages $u_1$, $u_2$ are indicated by arrows in FIG. 1. Given a positive current i, one of the output stage 10 or 10', with a positive output voltage $u_1$ or $u_2$, supplies outputs energy to the load circuit 16 so that it intensifies the current flow; and the other of the output stages 10 or 10' with negative output voltage $u_1$ or $u_2$, by contrast accepts energy from the load circuit. When, for example, $u_1$ is positive and $u_2$ negative, then a charge transfer ensues from the output stage 10 to the output stage 10'.

As an example, FIG. 2a shows a voltage curve of the output voltage $u_1$ wherein positive and negative voltage pulses of +400 V and −400 V alternate (intermediate circuit voltage $u_{Z1}$=400 V). Due to the chronological meshing of the drive signals supplied by the control module 30, a positive pulse and a negative voltage pulse are generated in every switch clock cycle. Given the aforementioned switch clock of 50 kHz, the spacing between the points in time A and B or between D and E, respectively amounts to 20 μs. The voltage pulses each have a duration of 5 μs. The output voltage $u_2$ is assumed to be constantly zero. A voltage u at the load 14, which is the sum of $u_1$ and $u_2$, then has the same curve as $u_1$ (FIG. 2a). Such a voltage curve leaves the current i in the load circuit 16, which has current change times in the ms range, unmodified on average.

Given the voltage curves shown in FIG. 2b through FIG. 2g, the control module 30 has recognized an intermediate circuit voltage $u_{Z1}$ in the output stage 10 which is too high. The control module 30 informs the control module 30' thereof by emitting a charge transfer signal at the discharge signal output 48, which reaches the control module 30' via the charging signal input 46'.

After the output of the charge transfer signal, the control module 30 begins a charge output mode at a point in time C synchronized with its switch clock whereby a positive voltage $u_1$=400 V is connected to the load circuit (FIG. 2b and FIG. 2e) instead of the voltage $u_1$=0 V (FIG. 2) that is actually provided. Given the flow direction of the current i shown in FIG. 1, the output stage 10 thus supplies energy to the load circuit 16. The control module 30 determines the polarity of the voltage $u_1$ required for a charge output mode dependent on the current direction signal which is present at the input 44. In the exemplary embodiment described herein, the charge output mode lasts 5 μs until point in time D, and its voltage amplitude-time area amounts to 2•10$^{-3}$ volt-seconds.

FIG. 2c and FIG. 2f show two alternative embodiments of the charge pick-up mode of the output stage 10'. In both instances, the voltage $u_2$ should be constantly zero during normal operation of the output stage 10'. The charge pick-up mode is enabled by the reception of the charge transfer signal via the charging signal input 46', however, it only begins at a point in time synchronized with the switch clock of the control module 30'. For simplicity, this point in time coincides with the point in time C in FIG. 2c and FIG. 2f. During actual operation, this will usually occur only when the switch clocks of the control modules 30, 30' are synchronized. By contrast, slight time shifts occur given two unsynchronized (independent) switch clocks.

The output stage 10' has an intermediate circuit voltage $u_{Z2}$=600 V. During charge pick-up mode, this voltage (again dependent on the current direction signal at the input 44') is connected to the load circuit 16 with a suitable polarity. Given the current direction i according to FIG. 1, $u_{Z2}$ is switched as negative output voltage $u_2$ =−600 V, so that energy is taken from the load circuit 16. As a result, an energy flow ensues from the output stage 10 to the output stage 10'.

Given the exemplary embodiment shown in FIG. 2c, the charge pick-up mode of the output stage 10' lasts just as long as the charge output mode of the output stage 10, i.e. 5 μs here. Since the current i through the two output stages 10, 10' is the same, the output stage 10' accepts the same charge amount as the output stage 10 delivers. Due to its lower intermediate circuit voltage, however, the output stage 10 outputs less energy than the output stage 10' picks up. The difference is taken from the load circuit 16. As shown in FIG. 2d, a voltage u=−200 V is present at the load 14 during the charge transfer mode (from time C until time D). This voltage opposes the current flow through the load 14 and thus represents a disturbance for the regulation of the current flow in the load circuit 16. In this exemplary embodiment with constant current amplitude-time areas, it is therefore provided to supply a current regulating means with a suitable correction signal in every charge transfer mode, so that the disturbance can be compensated without control delay.

Such a disturbance does not occur given the exemplary embodiment shown in FIG. 2f. Here, a constant voltage amplitude-time area is provided for the charge output mode and for the charge pick-up mode, so that the amount of energy delivered by the output stage 10 is in turn exactly accepted by the output stage 10'. In the exemplary embodiment described herein, the voltage-time area amounts to 2•10$^{-3}$ volt-seconds. Given an intermediate circuit voltage $u_{Z2}$=600 V, the charge pick-up mode of the output stage 10' thus has a duration of about 3.3 μs. As proceeds from FIG. 2g, the voltage-time area of the voltage u at the load 14 amounts to zero between the points in time C and D (charge transfer mode). The current i in the load circuit 16 in fact fluctuates briefly; after the end of the charge transfer mode (point in time D), however, its intensity is the same as before (point in time C).

In the exemplary embodiments of FIG. 2b through FIG. 2g, the charge transfer mode has been inserted into a regular switch clock (from time B until time E). In an alternative embodiment, the switch clock can be lengthened in order to insert a charge transfer mode. It is also possible to employ one or more switch clocks for a charge output or charge pick-up mode. The output stages are then driven exclusively for the charge compensation during this time. The input signals at the terminals 42, 42' are ignored during this time.

Typically, a number of charge transfer clocks are required in order to compensate an over-voltage in an output stage 10 or 10'. In an alternative embodiment, the maximum number of successive charge transfer clocks (or the maximum length of the charge transfer mode) is limited, for example to 16 switch clocks (pulses). If the over-voltage has not been dismantled by then, an error is reported and the gradient amplifier is switched into a secure operating condition.

In the exemplary embodiment shown in FIG. 1, the control modules 30, 30' communicate only via the discharge signal outputs 48, 48' and the charging signal inputs 46, 46'. The duration or the voltage amplitude-time area of each charge transfer mode is fixed. It can be provided in alternative embodiments that the control modules 30, 30' also exchange information about the amount of energy or charge to be transferred.

FIG. 1 shows a gradient amplifier with two output stages 10, 10' and a control stage formed of two control modules 30, 30'. In alternative embodiments, the gradient amplifier can include more than two output stages, each with an allocated control module. For example, FIG. 3 shows three control modules 30, 30', 30" that are connected to form a ring structure and together form a control stage for three output stages. The respective discharge signal outputs 48, 48', 48" of the control modules 30, 30', 30" are connected to the respective charging signal input 46, 46', 46" of that control module 30, 30', 30" which follows in the ring.

During operation of an arrangement according to FIG. 3, an output stage for charge acceptance is permanently allocated to each output stage that supplies charge at its output. It is assumed that an over-voltage will exist in at most one output stage at any given point in time. When a control module 30, 30', 30" whose allocated output stage exhibits an over-voltage receives a charge transfer signal via its charging signal input 46, 46', 46", then this is interpreted as a malfunction. The gradient amplifier is then switched into a secure operating condition.

The gradient amplifier shown in FIG. 1 with charge transfer cycles according to FIG. 2e through FIG. 2g is currently considered to be the best mode of implementing the invention.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a power amplifier having a plurality of switched output stages, each of said output stages including a charging capacitor, said method comprising the steps of:
   identifying an over-voltage condition in one of said output stages by measuring an intermediate circuit voltage across the charging capacitor of that output stage;
   switching said one of said output stages affected by said over-voltage condition into a charge output mode in which charge is supplied as an output of said one of said output stages for a limited time duration by supplying drive signals to said one of said output stages;
   switching at least one other of said output stages into a charge pick-up mode in which charge is picked up by said at least one other of said output stages for a limited time duration by means of drive signals supplied to said at least one other of said output stages; and
   coupling said plurality of output stages so that energy supplied as an output by said one of said output stages in the charge output mode is picked-up by said at least one other of said output stages switched into said charge pick-up mode.

2. A method as claimed in claim 1 comprising the step of supplying respective drive signals to said one of said output stages and to said at least one other of said output stages for causing the respective time durations of said charge output mode and said charge pick-up mode to overlap in time.

3. A method as claimed in claim 1 comprising the additional step of ending said charge output mode and ending said charge pick-up mode when a predetermined voltage amplitude-time area of an output of said one output stage occurs.

4. A method as claimed in claim 1 comprising the step of supplying drive signals to said one of said output stages and to said at least one other of said output stages for causing the duration of said charge output mode to be equal to the duration of said charge pick-up mode.

5. A method as claimed in claim 1 comprising the step of generating pulse-width modulated signals employing a switching clock signal having a clock frequency as said drive signals for switching said one of said output stages and said drive signals for switching said at least one other of said output stages, all of said drive signals having a frequency equal to said clock frequency.

6. A method as claimed in claim 5 wherein said switching clock signal comprises a plurality of switching clock pulses, and comprising the additional step of making the duration of at least one of said charge output mode and said charge pick-up mode equal to a duration of a switching clock pulse or a whole multiple of said duration of a switching clock pulse.

7. A method as claimed in claim 5 wherein said switching clock signal has a clock cycle associated therewith, and comprising the additional step of inserting at least one of said charge output mode and said charge pick-up mode into a switching clock cycle without lengthening a duration of said switching clock cycle.

8. A method as claimed in claim 5 wherein said switching clock signal has a clock cycle associated therewith, and comprising the additional step of inserting at least one of said charge output mode and said charge pick-up mode into said clock cycle and thereby lengthening a duration of said clock cycle by at least one of the duration of said charge output mode and the duration of said charge pick-up mode.

9. A control mode for driving an output stage of a power amplifier, said output stage including a charging capacitor and being operable in a normal mode and in a charge output mode in which charge is supplied as an output stage, said control module comprising:
   at least one sampling input for determining an over-voltage condition of said output stage by measuring an intermediate circuit voltage across said charging capacitor of said output stage; and
   means responsive to an identification of said over-voltage condition for supplying a signal to a discharge signal output for switching said output stage from said normal mode into said charge output mode for a limited time duration.

10. A driver circuit as claimed in claim 9 wherein said output stage is also operable in a charge pick-up mode in which charge is picked up by said output stage, and said driver circuit further comprising:
    a charging signal input; and
    means responsive to a signal at said charging signal input for switching said output stage into said charge pick-up mode for a limited time duration.

11. A power amplifier comprising:
    a plurality of output stages, each output stage including a charging capacitor, and each output stage being operable in a normal mode, a charge output mode in which charge is supplied as an output of said output stage, and a charge pick-up mode in which charge is picked up by said output stage;
    control means for identifying an over-voltage condition in any of said output stages by measuring an intermediate circuit voltage across the charging capacitor of that output stage; and
    said control means including means, upon an identification of an over-voltage condition in one of said output stages, for switching said one of said output stages from said normal mode to said charge output mode for a limited time duration and for switching another one of said output stages from said normal mode into said charge pick-up mode for a limited time duration.

12. A power amplifier as claimed in claim 11 wherein said control means comprises a plurality of control modules each having a discharge signal output and a charging signal input, said control modules being connected together in a ring structure via said discharge signal outputs and said charging signal inputs.

* * * * *